United States Patent
Saka

(10) Patent No.: US 7,125,262 B2
(45) Date of Patent: Oct. 24, 2006

(54) ELECTRICAL CONNECTOR BOX

(75) Inventor: Yuuji Saka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 11/092,726

(22) Filed: Mar. 30, 2005

(65) Prior Publication Data

US 2005/0221641 A1 Oct. 6, 2005

(30) Foreign Application Priority Data

Apr. 1, 2004 (JP) ............................. 2004-109282

(51) Int. Cl.
*H01R 12/00* (2006.01)
*H05K 1/00* (2006.01)
(52) U.S. Cl. .................................................. 439/76.2
(58) Field of Classification Search .............. 439/76.2, 439/76.1, 621
See application file for complete search history.

(56) References Cited

U.S. PATENT DOCUMENTS

| | | | |
|---|---|---|---|
| 6,220,875 B1 | 4/2001 | Kawakita | 439/76.2 |
| 6,325,640 B1 * | 12/2001 | Kasai | 439/76.2 |
| 6,670,548 B1 | 12/2003 | Sumida et al. | 174/50 |
| 6,677,521 B1 | 1/2004 | Sumida et al. | 174/50 |

FOREIGN PATENT DOCUMENTS

| | | |
|---|---|---|
| JP | 2000-092660 | 3/2000 |
| JP | 2000-285988 | 10/2000 |
| JP | 2002-027634 | 1/2002 |
| JP | 2002-84630 | 3/2002 |

OTHER PUBLICATIONS

English Language Abstract of 2000-92660.
English Language Abstract of 2002-27634.
English Language Abstract of 2000-285988.
English Language Abstract of 2002-84630.
U.S. Appl. No. 11/092,853 to Yuuji Saka, which was filed on Mar. 30, 2005.
U.S. Appl. No. 11/092,710 to Yuuji Saka, which was filed on Mar. 30, 2005.
U.S. Appl. No. 11/000,189 to Yuuji Saka, which was filed on Dec. 1, 2004.

* cited by examiner

*Primary Examiner*—Javaid H. Nasri
(74) *Attorney, Agent, or Firm*—Greenblum & Bernstein, P.L.C.

(57) ABSTRACT

A thin, lightweight electrical connector box utilizing fewer components due to a construction in which air, instead of insulator boards, is used as the insulating material between the ECU, other electrical components, and an internal circuit contained within the electrical connector box. Externally facing connector modules are sandwiched between a lower case and un upper case. Mounting posts are formed on each end of connector modules to fixedly secure two ends of an ECU baseboard through insertion into opposing holes formed therein. The ECU baseboard is supported by connector modules within the region between the lower case and the upper case.

9 Claims, 7 Drawing Sheets

ELECTRICAL CONNECTOR BOX

CROSS REFERENCE TO RELATED APPLICATIONS

The present disclosure relates to subject matter contained in priority Japanese Application No. 2004-109282, filed on Apr. 1, 2004, which is herein expressly incorporated by reference in its entirety.

BACKGROUND OF THE INVENTION

1. Field of the Invention

The present invention relates to an electrical connector box including an improved structure for the internal support of an electronic control unit (ECU).

2. Description of Related Art

Japanese Kokai Patent 2002-84630 is an example of a prior art electrical connector box constructed to enclose an electronic control unit within a case. FIG. 7 illustrates electrical connector box 1 which is described by JP 2002-84630. As FIG. 7 illustrates, multiple bus bars 4 and insulator boards 5 are oriented in a stacked configuration within a case formed by upper case 2 and lower case 3, each bus bar 4 having been press blanked from a sheet of electrically conductive metal. Insulator board 6 is located between ECU 7 and bus bars 4.

Locating insulator board 6 between ECU 7 and bus bars 4 and other devices, however, increases the number of required components as well as the size and weight of electrical connector box 1.

In automotive applications where the electrical connector box is placed within the instrument panel opposing the front passenger seat facing the passenger's knees, it is preferable that space be provided between the instrument panel and the electrical connector box to provide a crush zone to lessen the force of impact should the passenger happen to strike the instrument panel as a result of sudden braking.

SUMMARY OF THE INVENTION

In consideration of the shortcomings of the prior art, the present invention includes a thin, lightweight electrical connector box utilizing fewer components in which insulator boards are not positioned between the ECU, internal circuits, and other electrical components and devices, and in which air is employed as part of the insulating structure.

An aspect of the present invention provides an electrical connector box including a lower case and an opposing upper case; a plurality of component modules provided between the lower case and the upper case, wherein at least one of the modules faces the exterior of the connector box; a plurality of ECU baseboard mounting posts provided on the modules facing the upper case; and a plurality of attaching elements provided on an ECU baseboard, the attaching elements configured for connection to respective mounting posts so that the modules support the ECU baseboard between the lower case and the upper case. Further, the plurality of component modules may include a connector module, a fuse module, and a relay module. Additionally, the mounting posts may be provided facing the perimeter of the upper case; and the attaching elements may be provided on the perimeter of the ECU baseboard and facing the mounting posts.

In a further aspect of the present invention, the electrical connector box may further include an ECU connector, into which terminals connected to ECU conductors project, extending from the perimeter of the ECU baseboard, the ECU connector being positioned in a concave portion formed within the connector module to form a structure that joins, locates, and externally exposes the connector module and ECU connector receptacle on the side of the case. Further, wherein the relay module is positioned within the central portion of the lower case, the relay module including a plurality of relays having conductors welded on an insulator board or mounted to a printed baseboard; the connector module and the fuse module are positioned along the perimeter of the relay module; the ECU baseboard, supported by the connector module and/or the fuse module, is positioned between the relay module and the upper case; and wherein electronic components mounted to the ECU baseboard extend toward the relay module and into spaces between the relays mounted thereto.

Further, the electrical connector box may further include a wire conductor internal circuit block positioned within the lower case; wherein the relay module is positioned over the internal circuit block; the connector module and the fuse module are positioned around the perimeter of the relay module at externally facing positions; the ECU is positioned over the relay module; and the upper case is positioned over the ECU.

In a further aspect of the present invention, the upper case and the lower case are substantially square shaped. Further, the electrical connector box may further include frame supports provided at the corners of the lower case, the frame supports configured to join to the lower case to the upper case. The assembled case may be substantially square shaped with an overall thin cross section. Further, the case may include an air insulation space provided between internal circuits and electrical components in said case.

Because the construction of the present invention supports and positions the ECU at a specific height through at least one of the connector, fuse, or relay modules within the case, space is provided between the other electrical components and internal circuits as a region of air insulation, thus eliminating the need to use conventionally employed insulator boards. This structure thus reduces the number of components while allowing the construction of a lighter electrical connector box that is thinner in cross section.

Also, because the ECU baseboard mounting posts are provided on at least one of the connector, fuse, or relay modules facing the perimeter surfaces of the upper case, the attaching elements on the ECU baseboard need only be connected to the mounting posts to secure the ECU within the case, thus providing a simple support structure for the ECU.

An ECU connector, into which terminals connected to ECU conductors project, extends from the perimeter of the ECU baseboard and includes a concave portion formed in the connector module, thus forming a structure that joins, locates, and externally exposes the connector module and ECU connector receptacle at the side of the case.

This structure is able to dependably locate and secure the ECU because the ECU connector receptacle, which extends from the perimeter of the ECU base board, joins to the concave portion formed in the connector module. In addition, the electrical connector box can be made having a thinner cross section due to the ECU connector receptacle being joined to the connector module in a vertically stacked orientation. Moreover, due to the ECU connector receptacle being located at an externally exposed location at the side of the case, the simple insertion of the appropriate connector into the ECU connector receptacle is all that is required to connect the terminals in the receptacle to the ECU conductors. Furthermore, making this connection from the side of the electrical connector box prevents the upward or downward extension of connectors, and thus allows the electrical connector box to have a thinner cross section.

It is preferable that the relay module be located within the central portion of the lower case and be equipped with multiple relays whose conductors are welded on an insulator board, or with multiple relays mounted to a printed baseboard. The connector module and fuse module are located along the perimeter of the relay module, and the ECU baseboard, which is supported by the connector module and or fuse module on the upper case side, is located between the relay module and upper case. Furthermore, it is preferable that the electronic components mounted to the ECU baseboard extend downward toward the relay module into the spaces between the relays mounted to the relay module.

Because this structure positions the relay module within the area surrounded by the connector module and or fuse module which are located along the outer perimeter of the case, the relays need not project from the external surface of the case, thus allowing the electrical connector box to be made to thinner cross section. Also, the electronic components attached to the ECU baseboard are provided on the side of the ECU facing the relay module, and extend into the space between the relays projecting from the insulator board of the relay module, thereby allowing the gap between the relay module insulator board and ECU baseboard to be made smaller, and the electrical connector box to be made in a thinner cross section.

It is preferable that the wire conductor internal circuit block be placed within the lower case, the relay module be placed over the internal circuit block, the connector module and fuse module be placed around the perimeter of the relay module at externally exposed positions, the ECU be placed over the relay module, and the upper case be placed over the ECU. It is further preferable that the upper and lower case be of approximately square shape with the upper case joining the lower case through frame supports provided at the four corners of the lower case, and that the assembled case be of approximately square shape and have an overall thin cross section.

Because the construction of the present invention locates the relay module within the central region of the case, and because the fuse module and connector module surround the perimeter of the relay module while being externally exposed from the side of the case, the relay receptacles, fuse receptacles, and connector receptacles need not be located on top of the upper case nor on the bottom of the lower case. Therefore, the absence of electrical components on the upper and lower surfaces of the case allow the electrical connector box to be made in thinner cross section.

Additionally, in a case in which the electrical connector box is provided in a vehicle at a location in front of a passenger, the thin cross section of the electrical connector box provides a greater amount of space between the connector box and the instrument panel, thereby allowing the instrument panel to crush inward to a greater extent should the passenger strike the panel, and thus reducing the shock of collision to provide enhanced protection for the passenger.

Further, because the relay module is located between the ECU and internal circuit block, if the ECU were to become dislodged and fall from its secured position on the upper surface of the connector module and/or fuse module, the ECU would remain insulated from the internal circuit block by the relay module.

As noted in the previous descriptions, because the electrical connector box invention provides a structure through which the ECU is supported by at least one among a connector module, fuse module, or relay module at a specific height within the case, an air insulation space can be provided between the internal circuits and the other electrical components in the case, and the conventionally used insulating boards can be eliminated. This structure thus reduces the size and thickness of the electrical connector box while reducing the number of components used in its construction. Moreover, the ECU can be simply installed and secured within the case by joining the attaching parts on the ECU baseboard to the ECU mounting posts provided on the upper case side of at least one among the connector module, fuse module, or relay module.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

Figure 1:
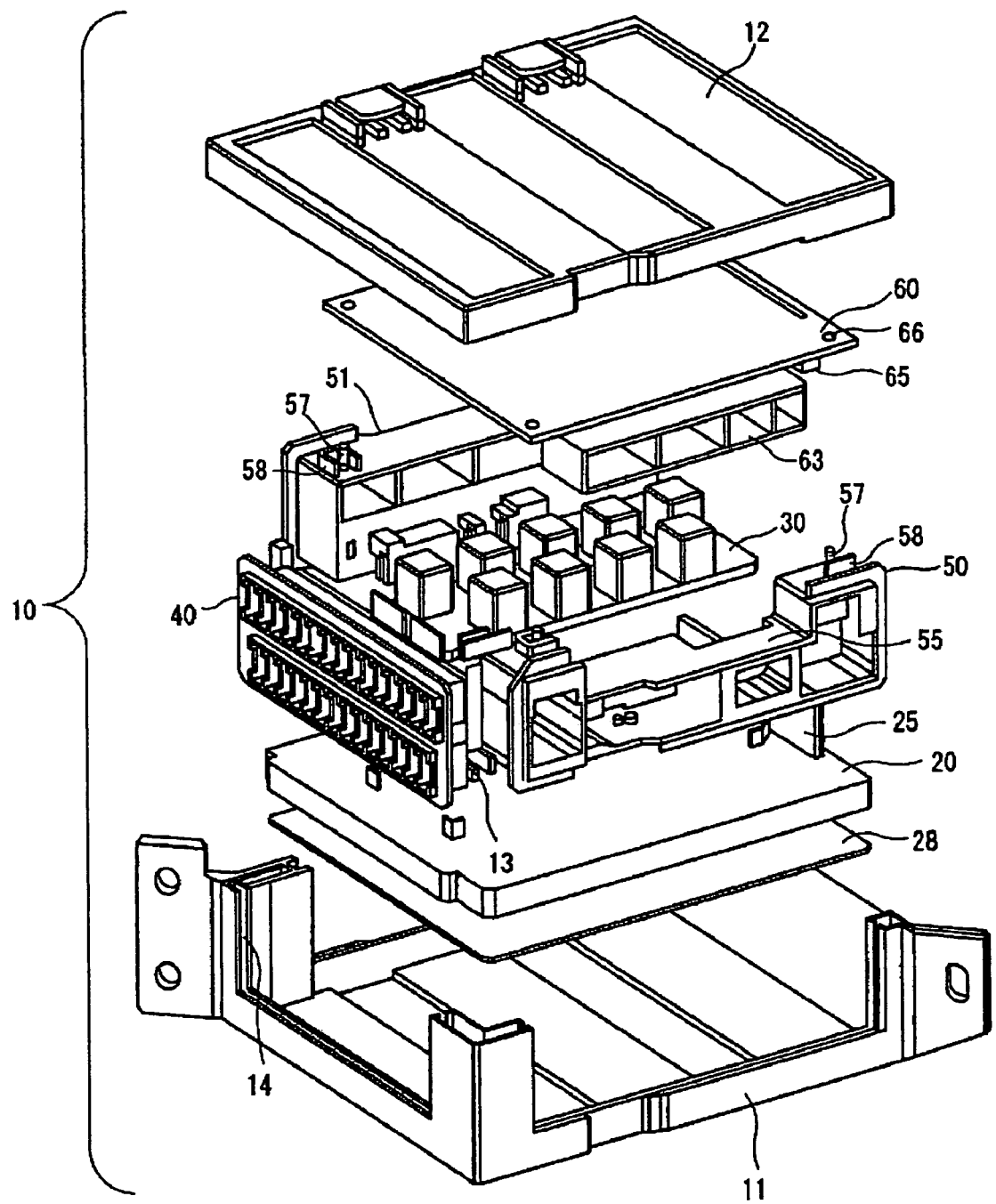
FIG. 1 is a perspective view of an electrical connector box according to an embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The following will describe preferred embodiments of the invention with reference to the drawings. FIGS. 1 through 6 describe an embodiment of the present invention in the form of electrical connector box 10 which includes internal circuit block 20 provided in the upper side of lower case 11, relay module 30 provided in the top part of internal circuit block 20 at the central portion of the case, fuse module 40 and connector modules 50 and 51 provided at locations peripheral to relay module 30, ECU (electronic control unit) 60 provided above relay module 30, and upper case 12 which covers the components.

Initially, the location and construction of ECU 60 will be described. ECU 60 is supported from below by connector modules 50 and 51 which are located on the respective right and left sides of connector box 10. Multiple connector receptacles 52 and 53 are respectively formed within connector modules 50 and 51, and are positioned between lower case 11 and upper case 12, exposed at the sides to the exterior of the connector box 10. Also, ECU connector 63 of ECU 60 mounts to cutout portion 55 which is provided on the upper side of connector module 50.

Figure 2:
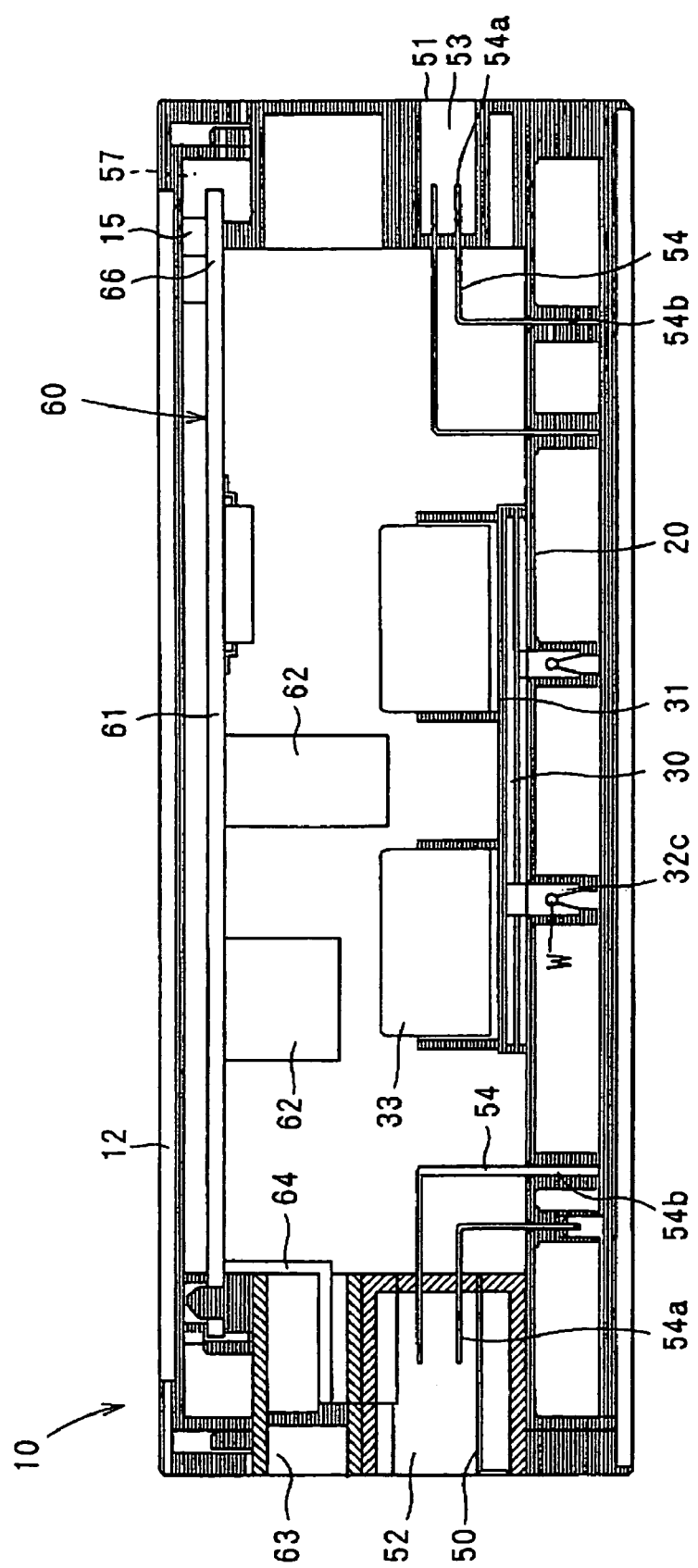
FIG. 2 is a cross sectional view of the ECU installation structure of the embodiment of FIG. 1.

As illustrated in FIGS. 1 and 2, connector modules 50 and 51 include posts 57, formed at the ends thereof, which extend toward the upper case, and also include ribs 58 formed in proximity to posts 57 in the region along the edge of ECU baseboard 61.

Apertures 66, which serve as attaching elements, are formed in ECU baseboard 61 of ECU 60 at locations opposing posts 57 of connector modules 50 and 51 , and ECU connector 63, which extends outward from and beneath the edge of ECU baseboard 61, fits into cutout portion 55 formed in connector module 50. The insertion of posts 57 of connector modules 50 and 51 into apertures 66 on ECU 60 results in ECU connector 63 being joined to cutout portion 55 in connector module 50, and ECU connector 63 and connector receptacles 52 of connector module 50 being externally exposed on the side of the case.

Pressure tabs 15 extend from specific points on the lower surface of upper case 12. When upper case 12 is placed over ECU 60, pressure tabs 15 press ECU baseboard 61 against connector modules 50 and 51, and posts 57 of connector modules 50 and 51 are permanently inserted into apertures 66 in ECU baseboard 61 to locate ECU 60 with respect to connector modules 50 and 51.

With ECU 60 secured in position on connector modules 50 and 51, electrical components 62, which have been soldered to the lower side of ECU baseboard 61, project into the space between relays 33 which are mounted to insulator board 31 of relay module 30. Posts 57 of connector modules 50 and 51 may also be provided on fuse module 40 which is located at the perimeter of ECU 60.

Figure 3:
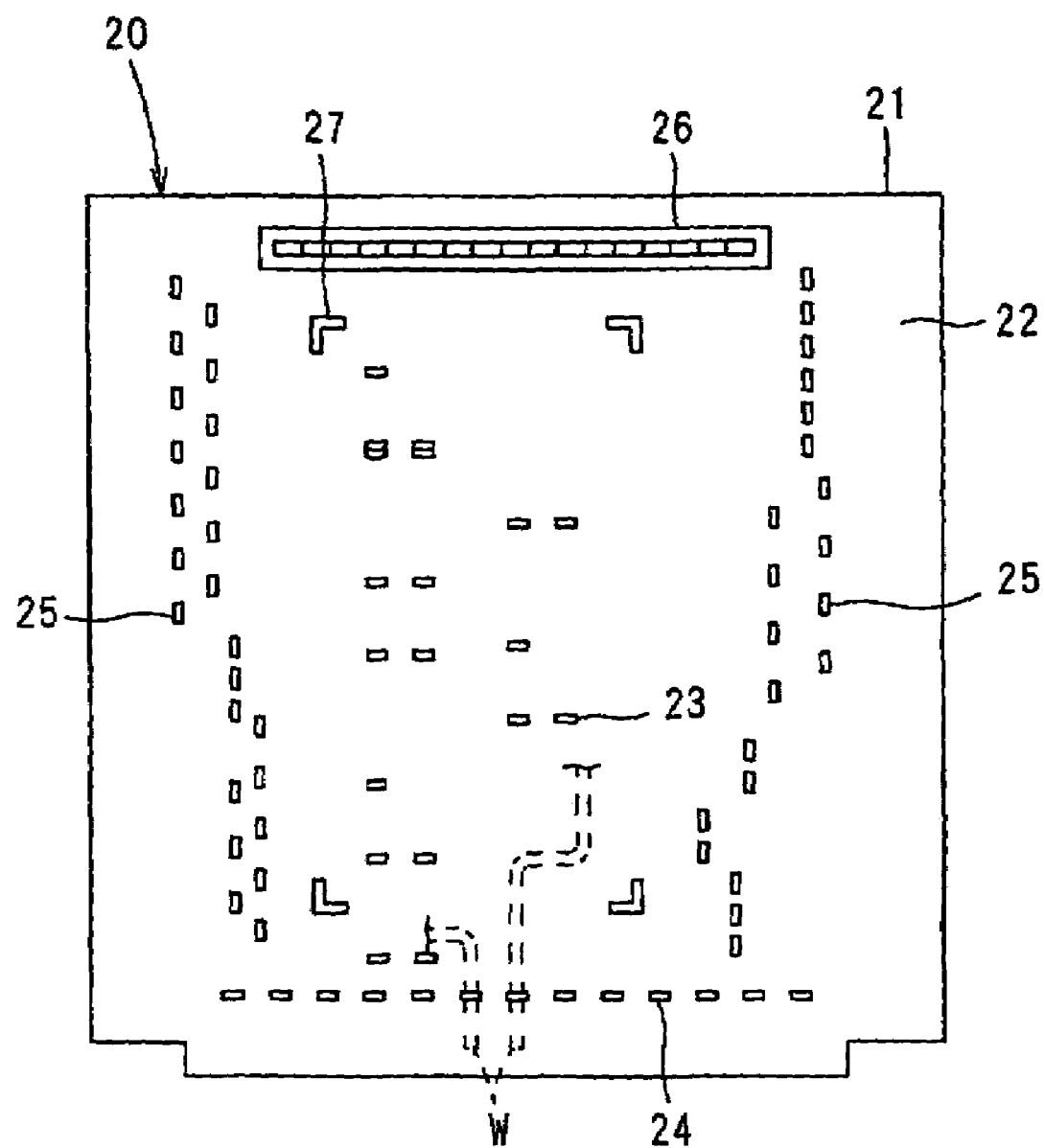
FIG. 3 is a top plan view of the internal circuit block of the embodiment of FIG. 1.

The following will explain the connecting structures between internal circuit block 20, relay module 30, fuse module 40, connector modules 50 and 51, and ECU 60. Wires 'w', which are the electrical conductors of internal circuit block 20, are positioned within open bottomed box shaped case 21, and are arranged on the underside of the top part of the case. As shown in FIG. 3, multiple terminal slots 23, 24 and 25 are formed in top plate 22 of case 21 at points in proximity to relay module 30, fuse module 40, and connector modules 50 and 51. Each connecting terminal 43 and 54 of bus bar 20 (of relay module 30), fuse module 40, and connector modules 50 and 51 passes through terminal slot 23, 24, or 25 and connects to wires 'w' inside of case 21. Female connector block 26 extends upward from the peripheral part of case 21 not occupied by fuse module 40 and connector modules 50 and 51, and connects to male connectors 65 on ECU 60 to connect wires 'w' to the ECU conductors. Four L-shaped locating posts 27 are provided on the upper surface of the central region of top plate 22 to position the four corners of insulator plate 31 of relay module 30. In addition, insulator plate 28 is provided beneath internal circuit block 20.

Relay module 30 is located over the central portion of internal circuit block 20. Bus bars 32, which are press blanked from conductive sheet metal to required shapes, are fixedly provided on the upper surface of insulator plate 31; and relays 33, whose terminal parts are welded to bus bars 32, are also fixedly attached to insulator board 31.

Figure 4:
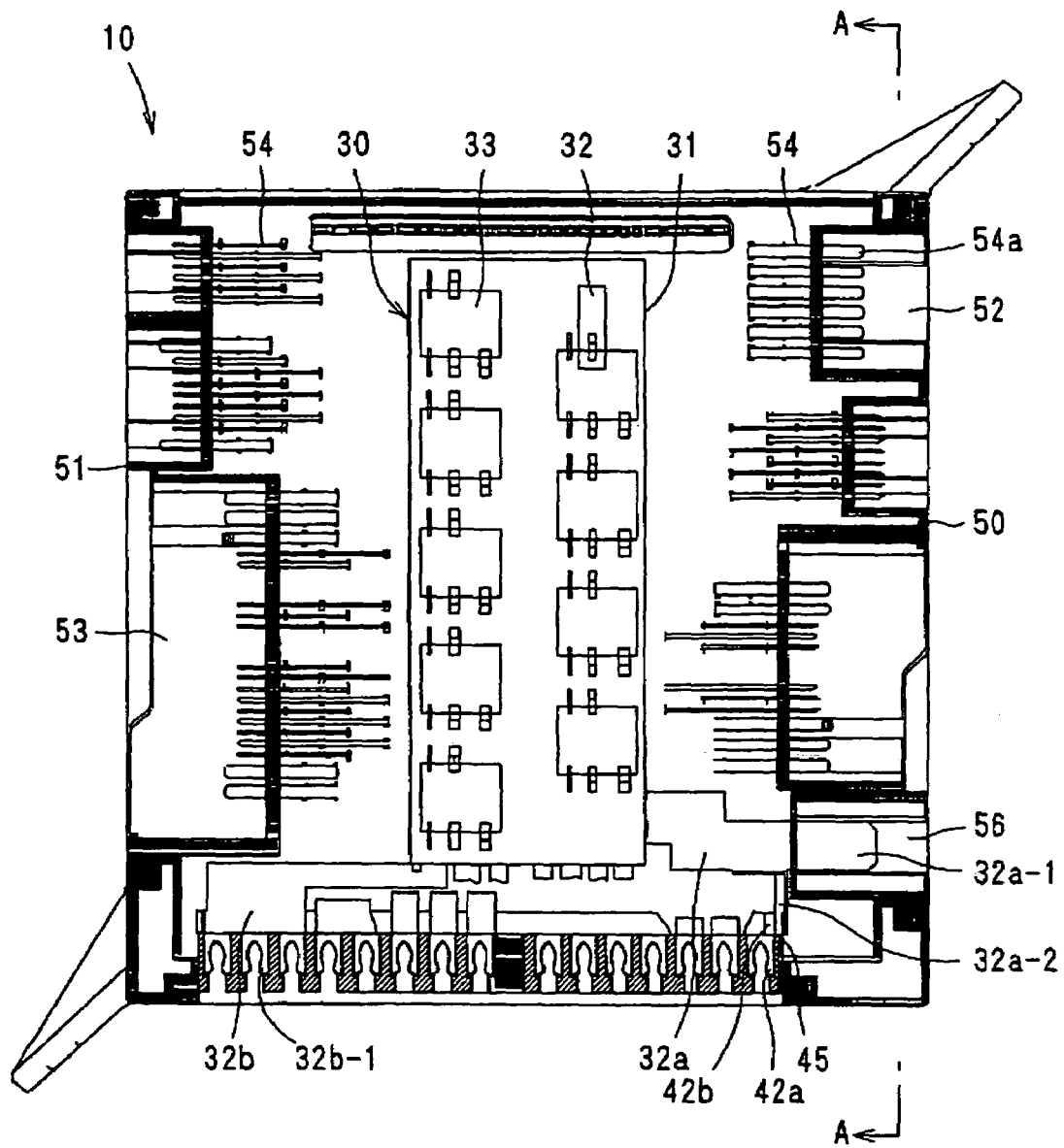
FIG. 4 is a cross sectional plan view of the electrical connector box of the embodiment of FIG. 1.

As illustrated in FIG. 4, electrical power is supplied to relay module 30 through input bus bar 32*a*. Terminal end 32*a*-1 of input bus bar 32*a* extends into connector receptacle 56 which forms the power input portion of connector module 50, and connects to a power terminal to be inserted therein. The other end of input bus bar 32*a* is soldered to the input terminals of relays 33. Regarding the output side of relay module 30, output bus bar 32*b*, which connects to fuses 44 of fuse module 40, extends horizontally from the edge of insulator plate 31, and the tips of friction tabs 32*b*-1 extend into fuse receptacles 41 of fuse module 40 to make friction connection to the input terminals of fuses 44. The portion of output bus bar 32*c* that does not connect to fuses 44 extends beneath insulator board 31, through terminal slots 23 formed in case 21 of internal circuit block 20, to make friction connection to wires 'w' of the internal circuit block. Relay module 30 may also include a printed circuit board on which multiple relays are mounted.

Fuse module 40 is located on the forward facing surface of electrical connector box 10 (the lower part of the connector box as shown in FIG. 4) and contains two horizontal rows of fuse receptacles 41 that are externally exposed on the side of the connector box between lower case 11 and upper case 12. The upper and lower fuse receptacle rows are mutually offset in the horizontal direction so as not to align vertically.

Figure 5:
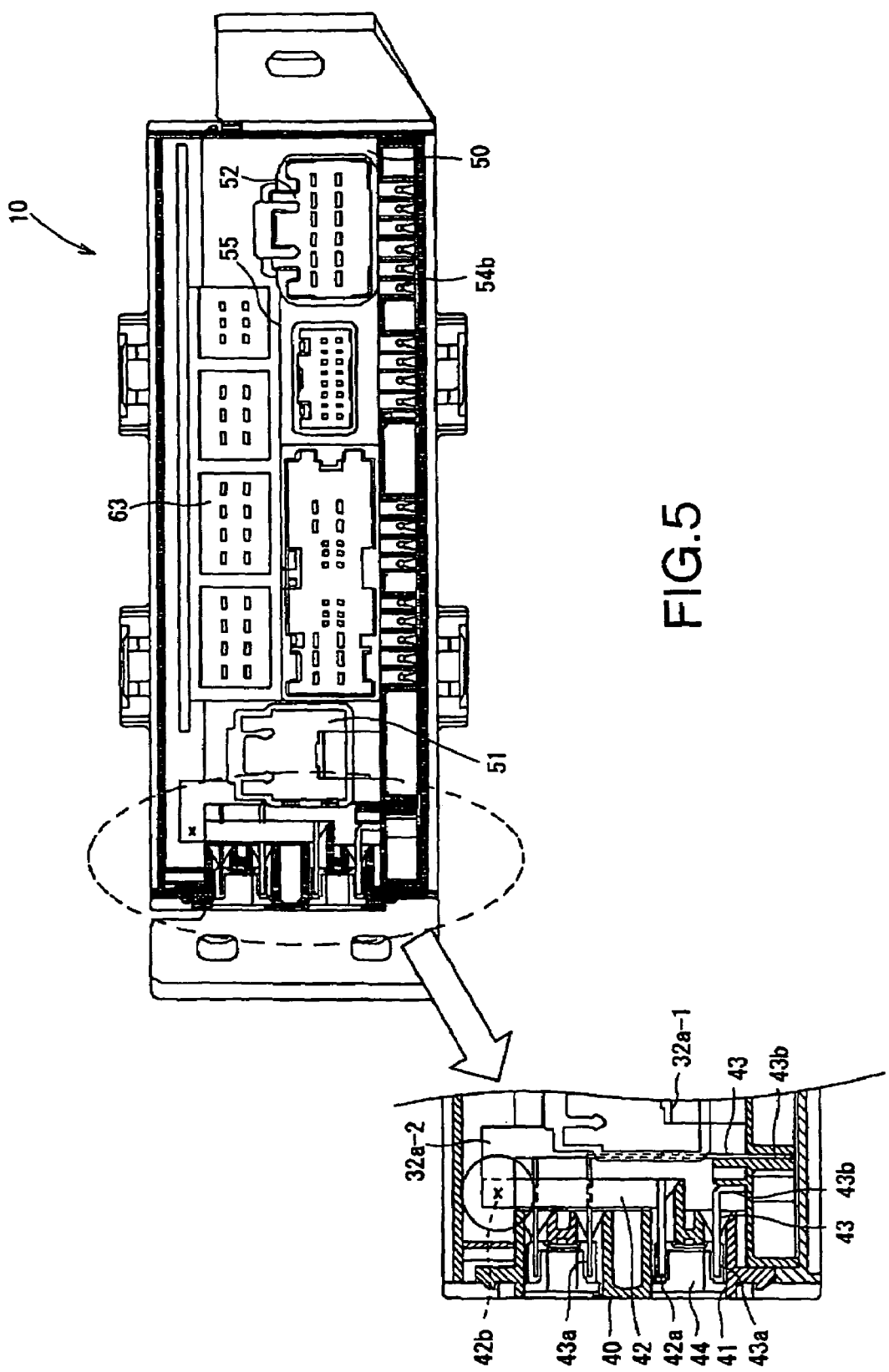
FIG. 5 is a cross sectional view through line A—A in FIG. 4 of the electrical connector box of the embodiment of FIG. 1.

Bus bar 42 connects to the input terminals of fuses 44 within fuse receptacles 41. As shown in FIG. 5, One end of bus bar 42 is formed as friction tab 42*a* that makes frictional connection with the fuse 44 terminal, and the other end 42*b* extends toward connector module 50 on the right side of electrical connector box 10. Connecting part 42*b* is resistance welded to connector part 32*a*-2, which branches off from relay module 30, to form welded joint 45. Therefore, attaching an electrical power connector to receptacle 56, which is the power input part of connector module 50, results in the supply of electrical power to both relay module 30 and fuse module 40. In addition, the input terminals of the fuses 44 that do not connect to bus bar 42 connect to friction tabs 32*b* of bus bar 32*b* which extend from relay module 30. As shown in FIG. 5, L-shaped connector terminals 43, each having two ends formed as friction connecting parts, connect to the output terminals of fuse 44. One end, which is end 43*a*, extends into fuse receptacle 41, and the other end, which is end 43*b*, bends downward and passes through terminal slot 24 into case 21 of internal circuit block 20 to make connection to wires 'w'.

Connector receptacles 52 and 53, which are parts of connector module 50 and 51, respectively, are externally exposed on the side of the connector box between lower case 11 and upper case 12. Connector receptacle 56 is formed as the electrical power input portion of connector module 50 (module 50 being positioned on the right side) and is externally exposed on the side of the connector box.

Connectors 54, which join to the terminals within the connector inserted into connector receptacles 52 and 53, are all formed in an "L" shape. One end of each connector is formed as male tab 54*a* that extends into connector receptacle 52 and 53 for connection to the terminal in the mating connector, and the other end is formed as friction connector 54*b* that bends downward and extends through a terminal slot 25, which is provided in case 21 of internal circuit block 20, for connection to wire 'w' of the internal circuit.

Figure 6:
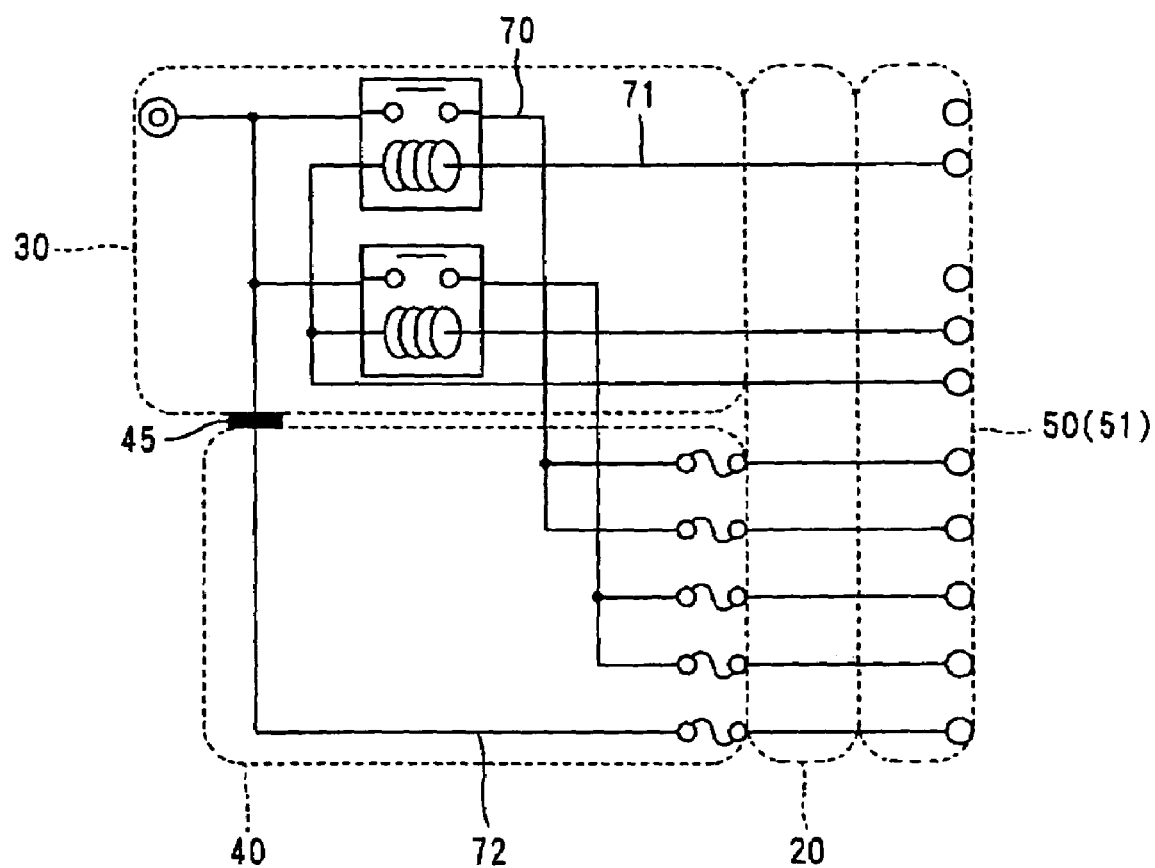
FIG. 6 is a schematic circuit diagram of the relay module, fuse module, internal circuit block, and connector modules of the embodiment of FIG. 1.
Figure 7:
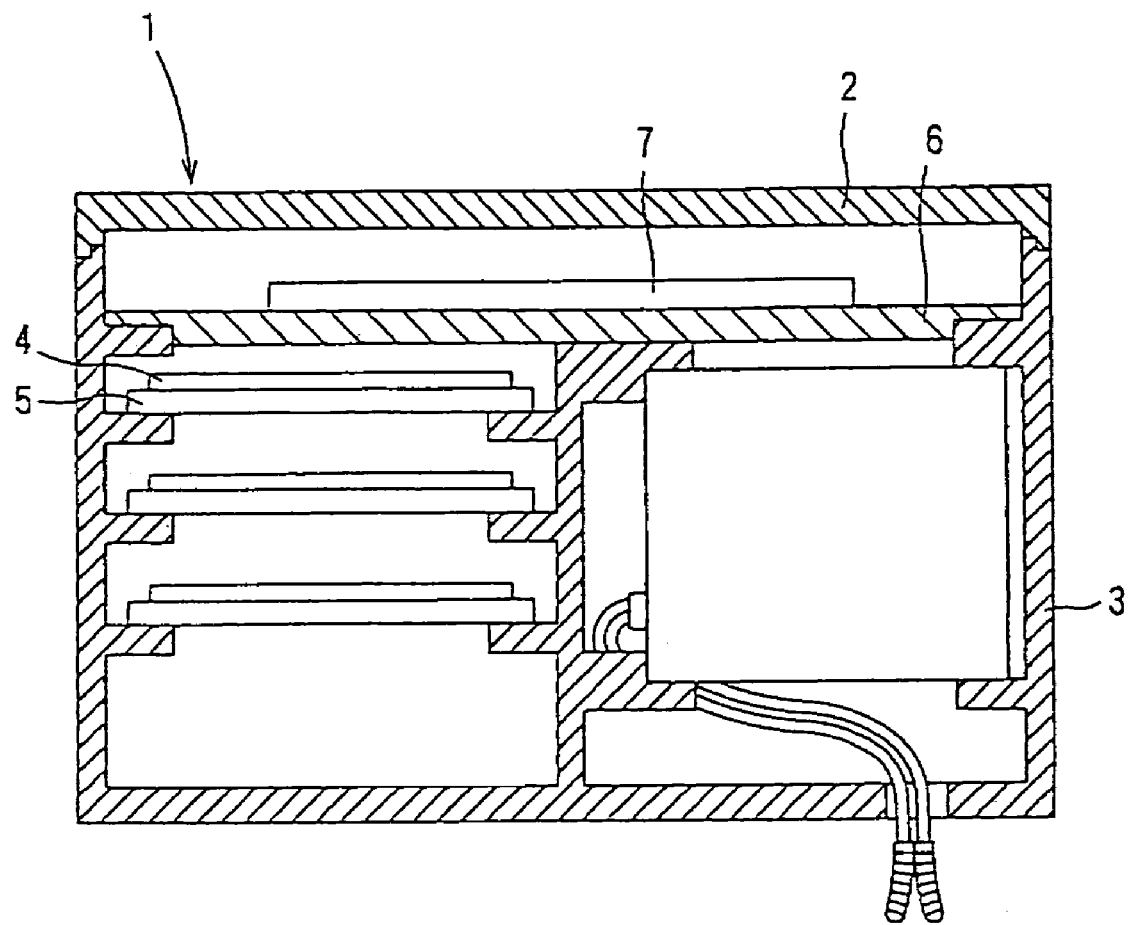
FIG. 7 is an example of the prior art.

FIG. 6 is a schematic circuit diagram of relay module 30, fuse module 40, and connector modules 50 and 51. Power circuit 70, which supplies power to the load side, forms a connection between the power input part and connector modules 50 and 51 through relay module 30, fuse module 40, and internal circuit block 20. Control circuit 71, which provides a control function for power circuit 70, connects the power input part to connector modules 50 and 51 through relay module 30 and internal circuit block 20. Also, additional circuit 72 is connected to the power input part through welded joint 45 without going through relay 33 of relay module 30, and thus makes connection to connector modules 50 and 51 directly through fuse module 40 and internal circuit block 20.

As illustrated in FIG. 1, female connector 65 projects from the lower edge of ECU baseboard 61 at the rear side of electrical connector box 10. Connector 65 joins to male connector 26, thereby joining respective terminals within each connector to connect wires 'w' in the internal circuit to the conductors of ECU 60, and thus supply electrical power to ECU 60. One end of contact terminals 64 connects to the conductors of ECU 60, and the other end extends into ECU connector 63 for connection to terminals of the connector to be inserted into ECU connector 63.

Frame supports 13 extend from the four corners of the floor plate of approximately square shaped lower case 11, and lower case 11 joins to approximately square shaped upper case 12 through frame supports 13. Fuse module 40 is located on the forward facing side of the assembly between lower case 11 and upper case 12, and connector modules 50 and 51 are located on the right and left sides, respectively at 90-degree angles to fuse module 40. Fuses are inserted into fuse module 40 in a direction 90 degrees to relays 33 which extend upward from the top surface of insulator board 31, as do the connectors that are inserted into the receptacles of connector modules 50 and 51. Frame supports 13 are L-shaped structures incorporating guide channels 14 formed in both ends, thereby providing a mechanism that guides the sliding insertion of the ends of each module into guide channels 14.

The following will describe the procedure through which electrical connector box 10 is assembled. Insulator board 28 and internal circuit block 20 are initially installed into lower case 11 from the top. Next, terminal end 32a-1 of relay module 30 input bus bar 32a is placed into connector receptacle 56 of connector module 50, friction tabs 32b-1 of output bus bar 32b are placed into fuse receptacle 41 of fuse module 40, and connector part 32a-2 of input bus bar 32a and connector part 42b of fuse module 40 bus bar 42 in fuse module 40, which mutually overlap, are joined through resistance welding. This single assembly of relay module 30, fuse module 40, and connector modules 50 and 51 is then placed onto internal circuit block 20. At this stage, the connector terminal of each module and bus bar friction tabs are inserted through the terminal slots in case 21 of internal circuit block 20, and frictionally connected to wires 'w' to form the internal circuit. The ECU is then placed on top of the modules, and female connector 65 is joined to male connector 26 of internal circuit block 20 to make connection between wires 'w' of the internal circuit and the ECU 60 conductors. Also, ECU connector 63 is joined to cutout portion 55 in connector module 50. Lastly, upper case 12 is placed over the assembly and connected to lower case 1 through frame supports 13.

This structure uses connector modules 50 and 51 to support the right and left edges of ECU 60 at a desired height, therefore providing space between ECU 60 and relay module 30 and mutually insulating the two components with air without the need for insulator boards used by prior art structures. This structure reduces weight, requires fewer components, and results in electrical connector box 10 having a thinner cross section.

In addition, this structure provides mounting posts 57, which are formed on connector modules 50 and 51 and extend upward toward upper case 12, for insertion into apertures 66 in the ECU baseboard, thus providing for the simple installation and securing of ECU 60 within the case. In addition, because electronic components 62 attached to ECU baseboard 61 extend into the space occupied by relays 33 which extend from insulator board 31, the gap between insulator board 31 of relay module 30 and ECU baseboard 61 is reduced, thus allowing electrical connector box 10 to be made to thinner cross section.

In particular, in an application where electrical connector box 10 is installed at a location in front of a passenger in an automobile, the reduced thickness of connector box 10 allows more space between connector box 10 and the instrument panel, thereby allowing the instrument panel to crush in to a greater extent should the passenger strike the panel due to sudden braking or like occurrence, thus reducing the shock of collision and providing enhanced protection for the passenger.

Moreover, while this embodiment describes the ECU as being supported from beneath by the connector modules, a structure may be employed wherein the fuse module and/or relay module support the ECU.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electrical connector box comprising:
   a lower case and an opposing upper case, said lower case defining a bottom of said electrical connector box and said upper case defining a top of said electrical connector box;
   a plurality of component modules provided between said lower case and said upper case, wherein at least one of said modules faces a side of the connector box;
   a plurality of ECU baseboard mounting posts provided on said modules facing said upper case; and
   a plurality of attaching elements provided on an ECU baseboard, said attaching elements configured for connection to respective said mounting posts so that said modules support said ECU baseboard between said lower case and said upper case.

2. The electrical connector box according to claim 1, wherein said plurality of component modules comprises a connector module, a fuse module, and a relay module.

3. The electrical connector box according to claim 2, wherein said relay module is positioned within the central portion of said lower case, said relay module including a plurality of relays having conductors welded on an insulator board or mounted to a printed baseboard;
   said connector module and said fuse module are positioned along the perimeter of said relay module;

said ECU baseboard, supported by said connector module and/or said fuse module, is positioned between said relay module and said upper case; and wherein electronic components mounted to said ECU baseboard extend toward said relay module and into spaces between said relays mounted thereto.

4. The electrical connector box according to claim 1, wherein said mounting posts are provided facing the perimeter of said upper case.

5. The electrical connector box according to claim 4, wherein said attaching elements are provided on the perimeter of said ECU baseboard and facing said mounting posts.

6. The electrical connector box according to claim 1, wherein said plurality of component modules includes a connector module, said electrical connector box further comprising:

an ECU connector, into which terminals connected to ECU conductors project, extending from the perimeter of said ECU baseboard, said ECU connector being positioned in a concave portion formed within said connector module to form a structure that joins, locates, and externally exposes the connector module and ECU connector receptacle on the side of the case.

7. The electrical connector box according to claim 1, further comprising:

a wire conductor internal circuit block positioned within said lower case;

wherein said relay module is positioned over said internal circuit block;

said connector module and said fuse module are positioned around the perimeter of said relay module at externally facing positions;

said ECU is positioned over said relay module; and said upper case is positioned over said ECU.

8. The electrical connector box according to claim 1, further comprising: frame supports provided at corners of said lower case, said frame supports configured to join said lower case to said upper case.

9. The electrical connector box according to claim 1, further comprising:

an air insulation space provided between internal circuits and electrical components in said case.

* * * * *